United States Patent
Tanaka (10) Patent No.: US 12,550,762 B2
(45) Date of Patent: Feb. 10, 2026

(54) INTERCONNECT SUBSTRATE AND METHOD OF MAKING THE SAME

(71) Applicant: SHINKO ELECTRIC INDUSTRIES CO., LTD., Nagano (JP)

(72) Inventor: Hikaru Tanaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 229 days.

(21) Appl. No.: 18/169,441

(22) Filed: Feb. 15, 2023

(65) Prior Publication Data

US 2023/0275015 A1  Aug. 31, 2023

(30) Foreign Application Priority Data

Feb. 28, 2022 (JP) .................. 2022-029986

(51) Int. Cl.
*H01L 23/498* (2006.01)
*H01L 21/48* (2006.01)

(52) U.S. Cl.
CPC .... *H01L 23/49838* (2013.01); *H01L 21/4857* (2013.01); *H01L 23/49822* (2013.01); *H01L 23/49894* (2013.01)

(58) Field of Classification Search
CPC ................................. H01L 23/49838
USPC ........................................ 174/257
See application file for complete search history.

(56) References Cited

U.S. PATENT DOCUMENTS

| | | | |
|---|---|---|---|
| 2008/0093109 A1* | 4/2008 | Hsu ................... | H05K 3/243 174/250 |
| 2008/0149383 A1 | 6/2008 | Kaneko et al. | |
| 2010/0147560 A1 | 6/2010 | Kaneko | |
| 2012/0006591 A1 | 1/2012 | Kaneko et al. | |
| 2015/0000966 A1* | 1/2015 | Jo .................... | H05K 1/092 174/257 |
| 2015/0144384 A1 | 5/2015 | Ho et al. | |
| 2016/0044792 A1* | 2/2016 | Kaneko ............... | H05K 3/4682 205/125 |
| 2018/0096926 A1 | 4/2018 | Imafuji et al. | |
| 2018/0139841 A1* | 5/2018 | Hu .................... | H05K 3/4038 |
| 2019/0103288 A1* | 4/2019 | Cho .................. | H01L 23/49866 |
| 2021/0092841 A1* | 3/2021 | Yoshida .............. | H05K 3/4605 |
| 2022/0037249 A1 | 2/2022 | Kim | |

(Continued)

FOREIGN PATENT DOCUMENTS

| | | |
|---|---|---|
| JP | 2006-013118 | 1/2006 |
| JP | 2008-141070 | 6/2008 |
| JP | 2012-019080 | 1/2012 |

OTHER PUBLICATIONS

Office Action mailed on Mar. 22, 2024 issued with respect to the related U.S. Appl. No. 18/046,557.

(Continued)

*Primary Examiner* — Timothy J Thompson (74) *Attorney, Agent, or Firm* — IPUSA, PLLC (57) ABSTRACT

An interconnect substrate includes a pad for external connection and an insulating layer, wherein part of a lower surface of the pad is covered with the insulating layer, wherein the pad is situated in a recess formed in an upper surface of the insulating layer, such that a groove is present between the pad and a perimeter of the recess around the pad in a plan view of the interconnect substrate, and wherein a bottom surface of the groove is coplanar with the lower surface of the pad.

11 Claims, 12 Drawing Sheets

(56) References Cited

U.S. PATENT DOCUMENTS

2023/0123522 A1\* 4/2023 Tanaka .................. H05K 1/115
    174/262
2023/0275015 A1  8/2023 Tanaka

OTHER PUBLICATIONS

Office Action mailed Oct. 5, 2023 issued with respect to the related U.S. Appl. No. 18/046,557.
Office Action mailed on Jun. 14, 2024 issued with respect to the related U.S. Appl. No. 18/046,557.
Office Action mailed Apr. 8, 2025 issued with respect to the related Japanese patent application No. 2021-171147.

\* cited by examiner

INTERCONNECT SUBSTRATE AND METHOD OF MAKING THE SAME

CROSS-REFERENCE TO RELATED APPLICATIONS

The present application is based upon and claims priority to the prior Japanese Patent Application No. 2022-029986 filed on Feb. 28, 2022, with the Japanese Patent Office, the entire contents of which are incorporated herein by reference.

FIELD

The present invention relates to interconnect substrates and methods of making the same.

BACKGROUND

An interconnect substrate includes, for example, a pad exposed through an insulating layer disposed as an outermost layer. The pad serves as an external connection pad for electrical connection to a motherboard or the like, for example. The manufacturing process of such an interconnect substrate includes, for example, a process of forming a pad for external connection on the upper surface of a support, a process of forming an insulating layer on the upper surface of the support to cover the pad for external connection, and a process of removing the support.

Capacitance increases with the area of the upper surface of a pad, which may cause an electrical signal to deteriorate. In recent years, thus, there has been a demand for reducing the area of the upper surface of a pad in order to reduce the capacitance. From the viewpoint of ensuring compatibility with conventional interconnect substrates in terms of connection to a socket or the like used with the interconnect substrates, there is also a demand to keep the size of the opening of an insulating layer around a pad even when the size of the pad is reduced.

Satisfying these demands requires the perimeter of a pad to be moved to inside the perimeter of an opening of the insulating layer situated around the pad in a plan view, without moving the perimeter of the opening of the insulating layer. In the case of the interconnect substrate described above, it is difficult to move only the perimeter of a pad to inside the perimeter of an opening of the insulating layer.

Accordingly, there may be a need to provide an interconnect substrate in which the perimeter of a pad for external connection is situated inside the perimeter of an opening of an insulating layer in a plan view.

PRIOR ART DOCUMENT

Patent Document

[Patent Document 1] Japanese Laid-Open Patent Publication No. 2008-141070

SUMMARY

According to an aspect of the embodiment, an interconnect substrate includes a pad for external connection and an insulating layer, wherein part of a lower surface of the pad is covered with the insulating layer, wherein the pad is situated in a recess formed in an upper surface of the insulating layer, such that a groove is present between the pad and a perimeter of the recess around the pad in a plan view of the interconnect substrate, and wherein a bottom surface of the groove is coplanar with the lower surface of the pad.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments for carrying out the invention will be described with reference to the accompanying drawings. In the drawings, the same elements are denoted by the same reference numerals, and a duplicate description thereof may be omitted.

First Embodiment

Structure of Interconnect Substrate

Figure 1A:
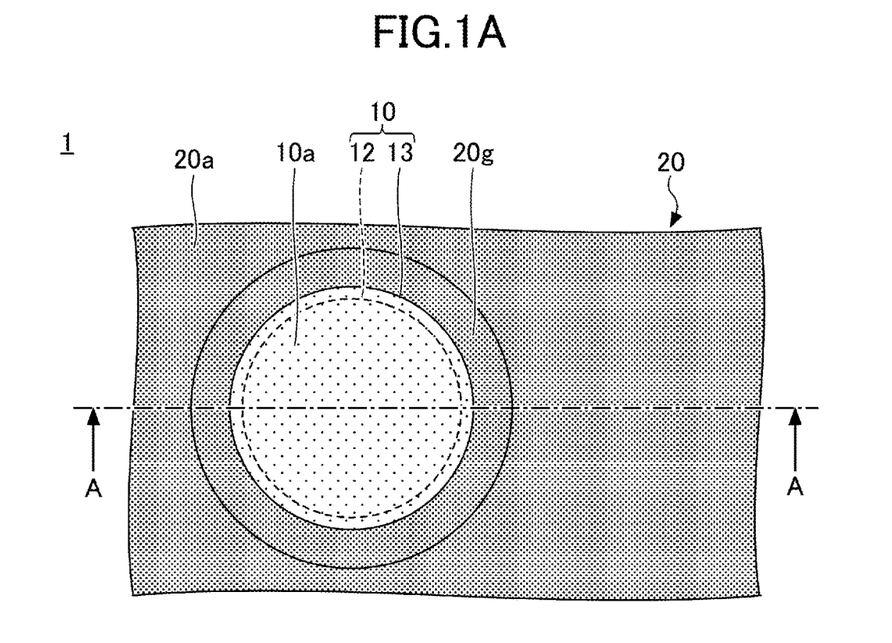
FIGS. 1A and 1B are drawings illustrating an interconnect substrate according to a first embodiment.
Figure 1B:
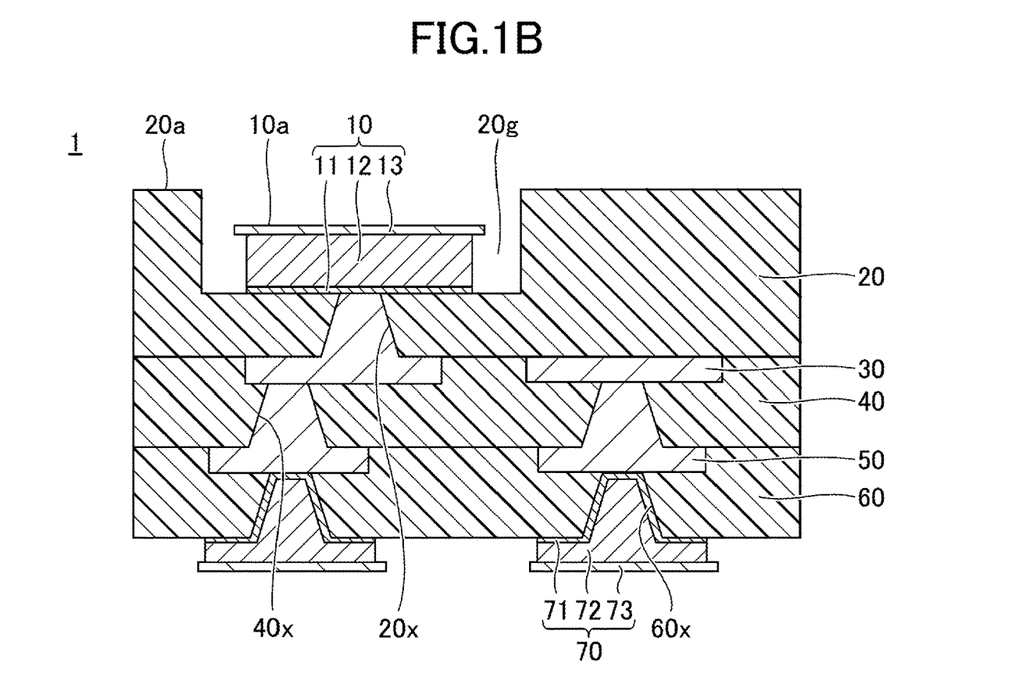

FIGS. 1A and 1B are drawings illustrating an example of an interconnect substrate according to a first embodiment. FIG. 1A is a partial plan view, and FIG. 1B is a partial cross-sectional view taken along the line A-A in FIG. 1A.

Referring to FIGS. 1A and 1B, an interconnect substrate 1 includes a pad 10, an insulating layer 20, an interconnect layer 30, an insulating layer 40, an interconnect layer 50, a solder resist layer 60, and an interconnect layer 70. The interconnect substrate 1 may be provided with a larger number of insulating layers and interconnect layers laminated one over another.

In the present embodiment, for the sake of convenience, the side of the interconnect substrate 1 on which the insulating layer 20 is situated in FIG. 1B is referred to as a first side or an upper side, and the side on which the solder resist layer 60 is situated is referred to as a second side or a lower side. The upper-side surface of any given member is referred to as a first surface or an upper surface, and the lower-side surface is referred to as a second surface or a lower surface. However, the interconnect substrate 1 may be used upside down or may be arranged at any angle. In addition, a plan view refers to a view of an object as viewed in the direction normal to the upper surface 20*a* of the insulating layer 20, and a plane shape refers to the shape of an object as viewed in the direction normal to the upper surface 20*a* of the insulating layer 20.

The pad 10 is a pad for external connection. The pad 10 can be used for electrical connection to a mounting substrate (not shown) such as a motherboard. The pad 10 is provided inside a groove 20*g* whose opening is on the upper surface 20*a* side of the insulating layer 20. The pad 10 has a laminated structure. The pad 10 includes, for example, a seed layer 11 in contact with the bottom surface of the groove 20*g*, a metal layer 12 laminated on the seed layer 11, and a surface covering layer 13 laminated on the metal layer 12. The metal layer 12 and the surface covering layer 13 are electrolytic plating layers.

The electrolytic plating layers formed on the seed layer 11 has a laminated structure. The metal layer 12 is, for example, a copper layer (Cu layer). The surface covering layer 13 laminated on the metal layer 12 is, for example, a gold layer (Au layer). The surface covering layer 13 may have a laminated structure having an Au layer as the uppermost layer. The surface covering layer 13 may be, for example, an Ni/Au layer (i.e., a metal layer in which an Ni layer and an Au layer are stacked in this order on the metal layer 12), an Ni/Pd/Au layer (i.e., a metal layer in which an Ni layer, a Pd layer, and an Au layer are stacked in this order on the metal layer 12), or the like. When the surface covering layer 13 is a Ni/Pd/Au layer, for example, the thickness of the Ni layer is about 5 μm to 10 μm, and the thickness of the Pd layer is about 0.015 μm to 0.065 μm, with the thickness of the Au layer being about 0.030 μm to 0.090 μm.

The side surface of the seed layer 11 and the side surface of the metal layer 12 are preferably substantially perpendicular to the bottom surface of the groove 20*g*. When the side surfaces of the seed layer 11 and the metal layer 12 are substantially perpendicular to the bottom surface of the groove 20*g*, voids are less likely to occur when a solder or underfill resin is provided in the groove 20*g*.

The perimeter of the surface covering layer 13 protrudes further out than the side surface of the metal layer 12 in an eaves-like manner toward the inner side surface of the groove 20*g*. That is, the area of the upper surface of the surface covering layer 13 is larger than the area of the upper surface of the metal layer 12. The length of the perimeter protrusion of the surface covering layer 13 as measured from the side surface of the metal layer 12 is, for example, about 2 μm to 3 μm. The area of the upper surface of the seed layer 11 is the same as the area of the upper surface of the metal layer 12.

The plane shape of the pad 10 is, for example, a circle having a diameter of about 600 μm to 800 μm. The plane shape of the pad 10 may alternatively be an elliptical shape, a rectangular shape, or any other shape.

The pad 10 is exposed on the upper surface 20*a* side of the insulating layer 20. The material of the insulating layer 20 may be, for example, an insulating resin containing an epoxy-based resin as a main component. The insulating layer 20 may contain a filler such as silica ($SiO_2$). The thickness of the insulating layer 20 may be, for example, about 10 μm to 70 μm.

A portion of the lower surface of the pad (i.e., the portion other than the portion connected to a via interconnect) is covered with the insulating layer 20. In addition, the upper surface 10*a* of the pad 10 is preferably positioned lower than the upper surface 20*a* of the insulating layer 20. The distance between the upper surface 10*a* of the pad 10 and the upper surface 20*a* of the insulating layer 20 is, for example, about 5 μm to 20 μm.

The insulating layer 20 is provided with a groove 20*g* that is situated around the pad 10 in a plan view and whose opening is on the upper surface 20*a* side of the insulating layer 20. In the case in which the plane shape of the pad 10 is circular, the groove 20*g* may have a ring shape such that its inner edge and outer edge are circles having different diameters in a plan view, for example. The width of the groove 20*g* may be, for example, about 80 μm to 100 μm. The bottom surface of the groove 20*g* is coplanar with the lower surface of the pad 10 (i.e., the lower surface of the seed layer 11). That is, the bottom surface of the groove 20*g* and the lower surface of the pad 10 are on the same plane.

The interconnect layer 30 is formed on the second side of the insulating layer 20. The interconnect layer 30 includes, for example, a via interconnect filling a via hole 20*x* that extends through the insulating layer 20 and exposes the lower surface of the pad 10, a via receiving pad formed on the lower surface of the insulating layer 20, and an interconnect pattern. The via interconnect extends through the insulating layer 20, and is in contact with the lower surface of the pad 10. The via hole 20*x* may have a truncated circular cone shape for which the diameter of the opening on the insulating layer side is larger than the diameter of the back end of the hole at the lower surface of the pad 10. Copper or the like, for example, may be used as the material of the interconnect layer 30. The thickness of the via receiving pad and the interconnect pattern constituting the interconnect layer 30 may be, for example, about 10 μm to 30 μm.

The insulating layer 40 is formed on the lower surface of the insulating layer 20 such as to cover the interconnect layer 30. The material and thickness of the insulating layer 40 may be, for example, substantially the same as those of the insulating layer 20. The insulating layer 40 may contain a filler such as silica ($SiO_2$).

The interconnect layer 50 is formed on the second side of the insulating layer 40. The interconnect layer 50 includes, for example, a via interconnect filling a via hole 40*x* that extends through the insulating layer 40 and exposes the lower surface of the via receiving pad of the interconnect layer 30, a pad formed on the lower surface of the insulating layer 40, and an interconnect pattern. The via hole 40*x* may have a truncated circular cone shape for which the diameter of the opening on the lower surface side of the insulating layer 40 is larger than the diameter of the back end of the hole at the lower surface of the via receiving pad of the interconnect layer 30. The material of the interconnect layer 50 and the thickness of the interconnect pattern constituting the interconnect layer 50 may be, for example, substantially the same as those of the interconnect layer 30.

The solder resist layer 60 is an insulating layer formed on the lower surface of the insulating layer 40 such as to cover the interconnect layer 50. The solder resist layer 60 may be formed of, for example, a photosensitive epoxy-based insulating resin, an acrylic insulating resin, or the like. The thickness of the solder resist layer 60 may be, for example, substantially the same as that of the insulating layer 20.

The interconnect layer 70 is formed on the second side of the solder resist layer 60. The interconnect layer 70 includes, for example, a via interconnect filling a via hole 60x that extends through the solder resist layer 60 and exposes the lower surface of the via receiving pad of the interconnect layer 50, a pad formed on the lower surface of the solder resist layer 60, and an interconnect pattern. The via hole 60x may have a truncated circular cone shape for which the diameter of the opening on the lower surface side of the solder resist layer 60 is larger than the diameter of the back end of the hole at the lower surface of the via receiving pad of the interconnect layer 50. The material of the interconnect layer 70 and the thickness of the interconnect pattern constituting the interconnect layer 70 may be, for example, substantially the same as those of the interconnect layer 30.

The interconnect layer 70 includes a seed layer 71 in contact with the lower surface of the solder resist layer 60, the inner surface of the via hole 60x, and the lower surface of the interconnect layer 50 exposed in the via hole 60x, and further includes a metal layer 72 laminated on the seed layer 71 and a surface covering layer 73 laminated on the metal layer 72. The metal layer 72 and the surface covering layer 73 are electrolytic plating layers. The materials of the seed layer 71, the metal layer 72, and the surface covering layer 73 may be, for example, substantially the same as those of the seed layer 11, the metal layer 12, and the surface covering layer 13, respectively. The thicknesses of the seed layer 71, the metal layer 72, and the surface covering layer 73 may be, for example, smaller than those of the seed layer 11, the metal layer 12, and the surface covering layer 13, respectively. The plane shapes of the seed layer 71, the metal layer 72, and the surface covering layer 73 may be, for example, smaller than the plane shapes of the seed layer 11, the metal layer 12, and the surface covering layer 13, respectively. The interconnect layer 70 includes pads for external connection. The pads of the interconnect layer 70 may be used for electrical connection to a semiconductor chip or the like, for example.

As described above, the interconnect substrate 1 is configured such that the insulating layer 20 is provided with the groove 20g that is located around the pad 10 in a plan view and whose opening is on the upper surface 20a side of the insulating layer 20. As a result, the perimeter of the pad 10 is properly positioned inside the perimeter of the opening of the insulating layer 20 (i.e., inside the outer edge of the groove 20g) in a plan view, which enables the area of the upper surface 10a of the pad 10 to be reduced. Reducing the area of the upper surface 10a of the pad 10 enables the reduction of the capacitance of the pad 10, thereby reducing the likelihood of deterioration of an electric signal propagating through the pad 10.

If the groove 20g were not provided, the perimeter of the opening of the insulating layer 20 exposing the upper surface 10a of the pad 10 and the perimeter of the pad 10 would be situated at the same position. In this case, making the area of the upper surface 10a of the pad 10 smaller than that of the conventional configuration would require the size of the opening to be also made smaller, thereby failing to ensure compatibility with conventional interconnect substrates.

To be more specific, a socket is used for connecting the pad 10 to a mounting substrate such as a motherboard, and the opening of the insulating layer that exposes the upper surface 10a of the pad 10 is required to have a proper size ensuring that the socket does not come in contact with the insulating layer 20. Because of this, reducing the capacitance of the pad 10 while ensuring compatibility with conventional interconnect substrates requires that the area of the upper surface 10a of the pad 10 is reduced without changing the size of the opening of the insulating layer 20. The area of the upper surface 10a of the pad 10 is properly reduced while securing compatibility with conventional interconnect substrates by providing the groove 20g that is situated around the pad 10 in a plan view and whose opening is on the upper surface 20a side of the insulating layer 20.

When the pad 10 and a mounting substrate such as a motherboard are connected to each other via solder, excess solder flows from the upper surface 10a of the pad 10 into the groove 20g, which reduces the likelihood of a short circuit between adjacent pads. Further, the provision of solder entering the groove 20g enables three-dimensional bonding between the solder and the upper surface 10a and side surface of the pad 10, thereby improving the joining strength between the pad 10 and the solder.

Since the perimeter of the surface covering layer 13 protrudes further out than the side surface of the metal layer 12 toward the inner side surface of the groove 20g, the presence of the solder in the groove 20g provides an anchor effect, which further improves the joining strength between the pad 10 and the solder. Alternatively, the groove 20g may be filled with an underfill material. This arrangement also produces an anchor effect, which serves to improve the joining strength between the pad 10 and the underfill material.

As the bottom surface of the groove 20g is situated lower than the upper surface 10a of the pad in the interconnect substrate 1, the center of gravity of the entire solder is located toward the center side of the interconnect substrate 1. This arrangement improves the reliability of connection between the pad 10 and the solder. In particular, this arrangement can significantly improve the durability of solder against a force that is applied in a horizontal direction of the interconnect substrate 1 (i.e., in a direction parallel to the upper surface 10a).

Method of Making Interconnect Substrate

In the following, a method of making the interconnect substrate according to the first embodiment will be described. FIGS. 2 through 10 are drawings illustrating an example of the method of making the interconnect substrate according to the first embodiment. This embodiment is directed to the process steps of making a single interconnect substrate. Alternatively, a plurality of structures to serve as respective interconnect substrates may be made as a single piece, followed by being separated into respective interconnect substrates. It may be noted that since steps illustrated in FIGS. 2 through 6 produce identical structures on both sides of a support, a relevant description may sometimes be provided only for one side.

Figure 2:
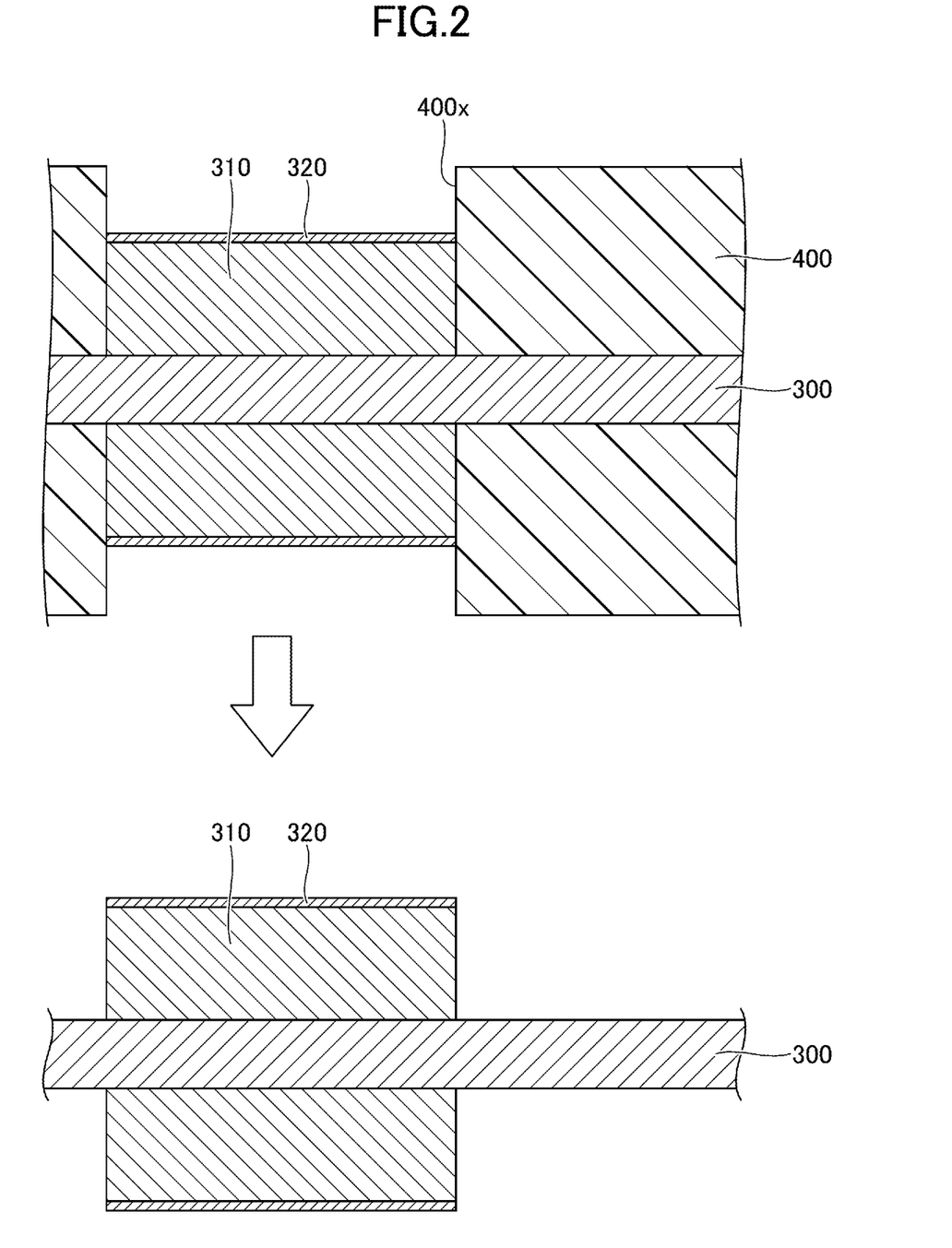
FIG. 2 is a drawing illustrating a method of making the interconnect substrate according to the first embodiment.

In the step illustrated in FIG. 2, a support 300 whose upper and lower surfaces are flat surfaces is prepared. A metal plate, a metal foil, or the like may be used as the support 300. The present embodiment is directed to an example in which a copper foil is used as the support 300. The thickness of the support 300 may be, for example, about 18 μm to 100 μm.

A resist layer 400 (for example, a dry film resist or the like) having an opening 400x larger than the pad 10 to be formed is provided at a predetermined position on the upper surface and the lower surface of the support 300. Sacrificial layers 310 and 320 are successively laminated on the upper surface and the lower surface of the support 300 exposed in the openings 400x of the resist layers 400 by an electrolytic plating method or the like using the support 300 as a plating power feeding layer. As an example, the sacrificial layer 310 is a copper layer, and the sacrificial layer 320 is a nickel layer. The thicknesses of the sacrificial layers 310 and 320 may properly be determined in consideration of the thickness of the pad 10 to be formed. After the sacrificial layers 310 and 320 are formed, the resist layers 400 are removed.

Figure 3A:
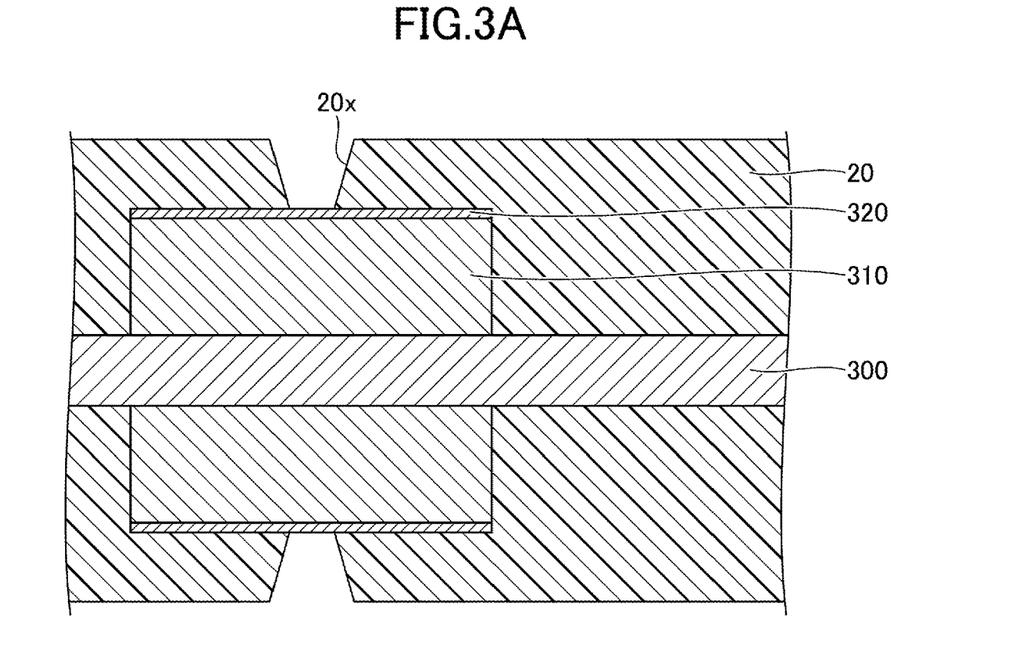
FIGS. 3A and 3B are drawings illustrating the method of making the interconnect substrate according to the first embodiment.

In the step illustrated in FIG. 3A, an epoxy-based resin film or the like in a semi-cured state is laminated on the upper surface of the support 300 such as to cover the upper surface and side surface of the sacrificial layers 310 and 320, and is then cured to form an insulating layer 20. In place of laminating an epoxy-based resin film or the like, an epoxy-based resin liquid, paste. or the like may be applied and then cured to form the insulating layer 20. The thickness and the like of the insulating layer are as described above. The same applies to the lower surface side of the support 300.

A via hole 20x is formed in the insulating layer 20 such as to extend through the insulating layer 20 and expose the upper surface of the sacrificial layer 320. The via hole 20x may be formed by, for example, a laser processing method using a $CO_2$ laser or the like. Thereafter, a desmear process may be performed to remove residual resins adhering to the upper surface of the sacrificial layer 320 exposed at the bottom of the via hole 20x. The same applies to the lower surface side of the support 300.

Figure 3B:
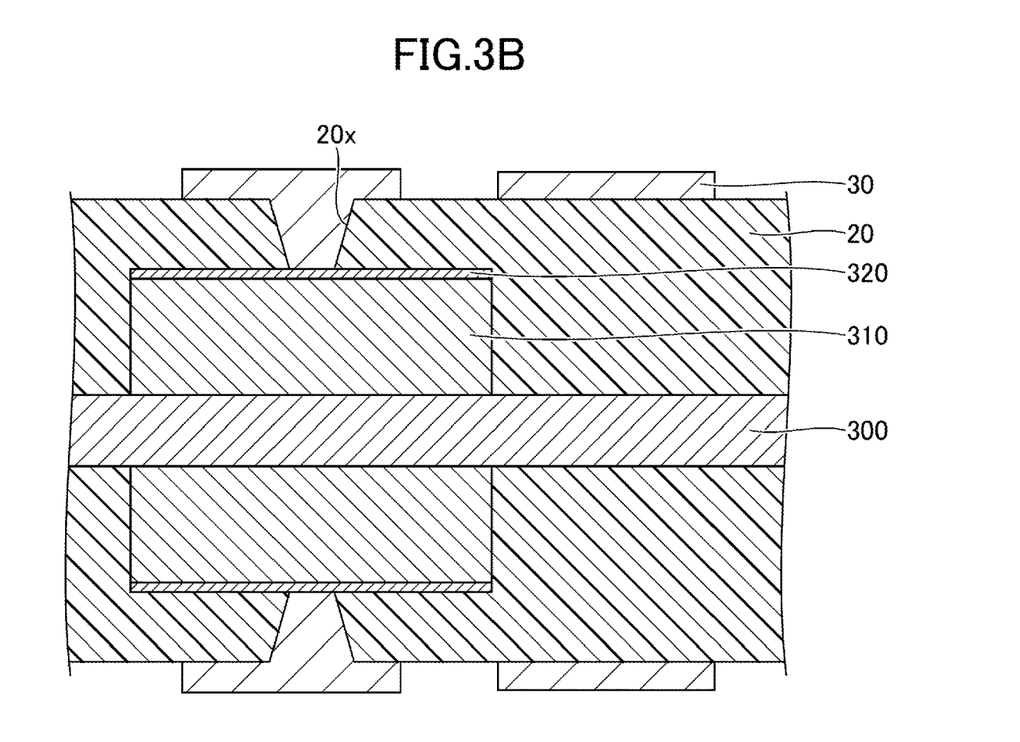

In the step illustrated in FIG. 3B, an interconnect layer 30 is formed on the insulating layer 20. The interconnect layer 30 includes, for example, a via interconnect filling the via hole 20x, a via receiving pad formed on the insulating layer 20, and an interconnect pattern. The interconnect layer 30 is electrically connected to the pad 10 exposed at the bottom of the via hole 20x. Copper (Cu) or the like, for example, may be used as the material of the interconnect layer 30. The interconnect layer 30 may be formed by any one of various types of interconnect layer forming method such as a semi-additive method and a subtractive method. The same applies to the lower surface side of the support 300.

Figure 4:
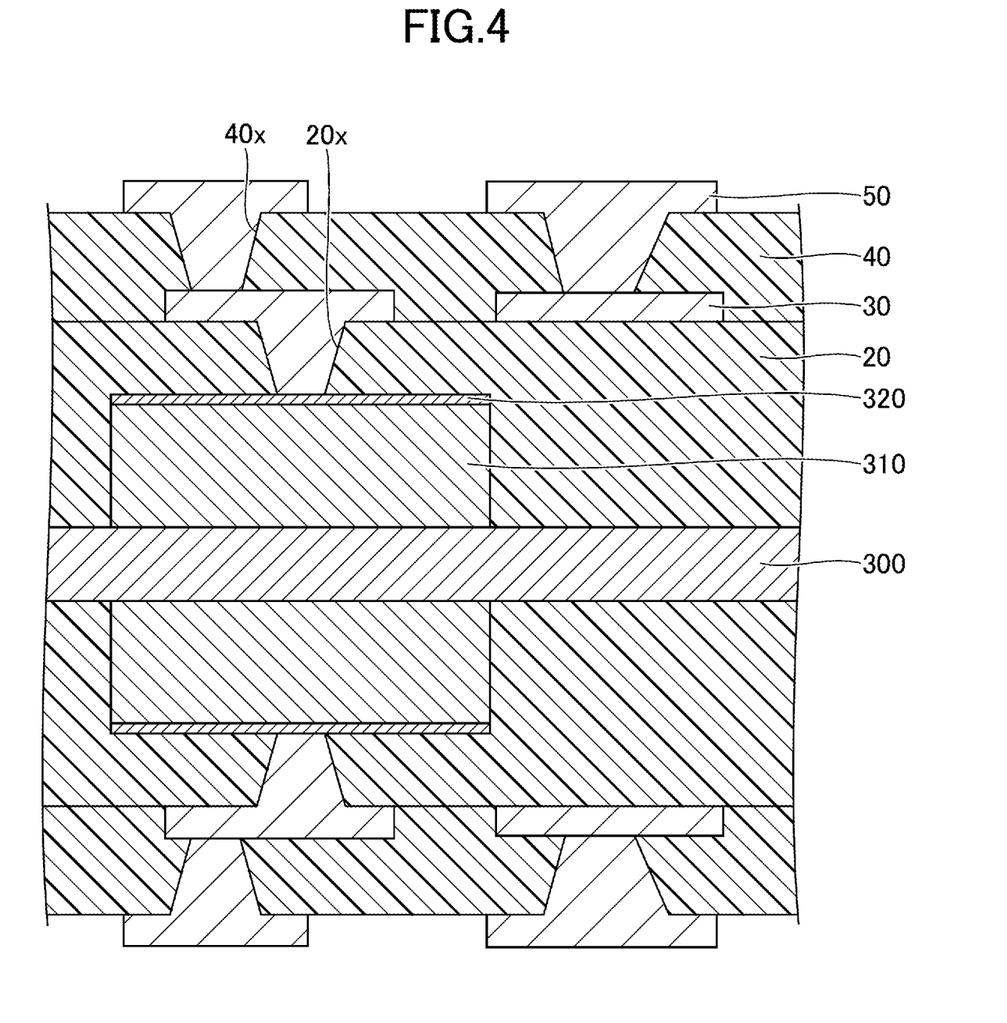
FIG. 4 is a drawing illustrating the method of making the interconnect substrate according to the first embodiment.

In the step illustrated in FIG. 4, the same steps as those illustrated in FIGS. 3A and 3B are repeated to form an insulating layer 40 on the interconnect layer 30, to form a via hole 40x in the insulating layer 40 to expose the upper surface of the via receiving pad of the interconnect layer 30, and to form an interconnect layer 50. The material and thickness of the insulating layer 40 may be, for example, the same as the material and thickness of the insulating layer 20. The material and thickness of the interconnect layer 50 may be, for example, the same as the material and thickness of the interconnect layer 30. The same applies to the lower surface side of the support 300.

Figure 5:
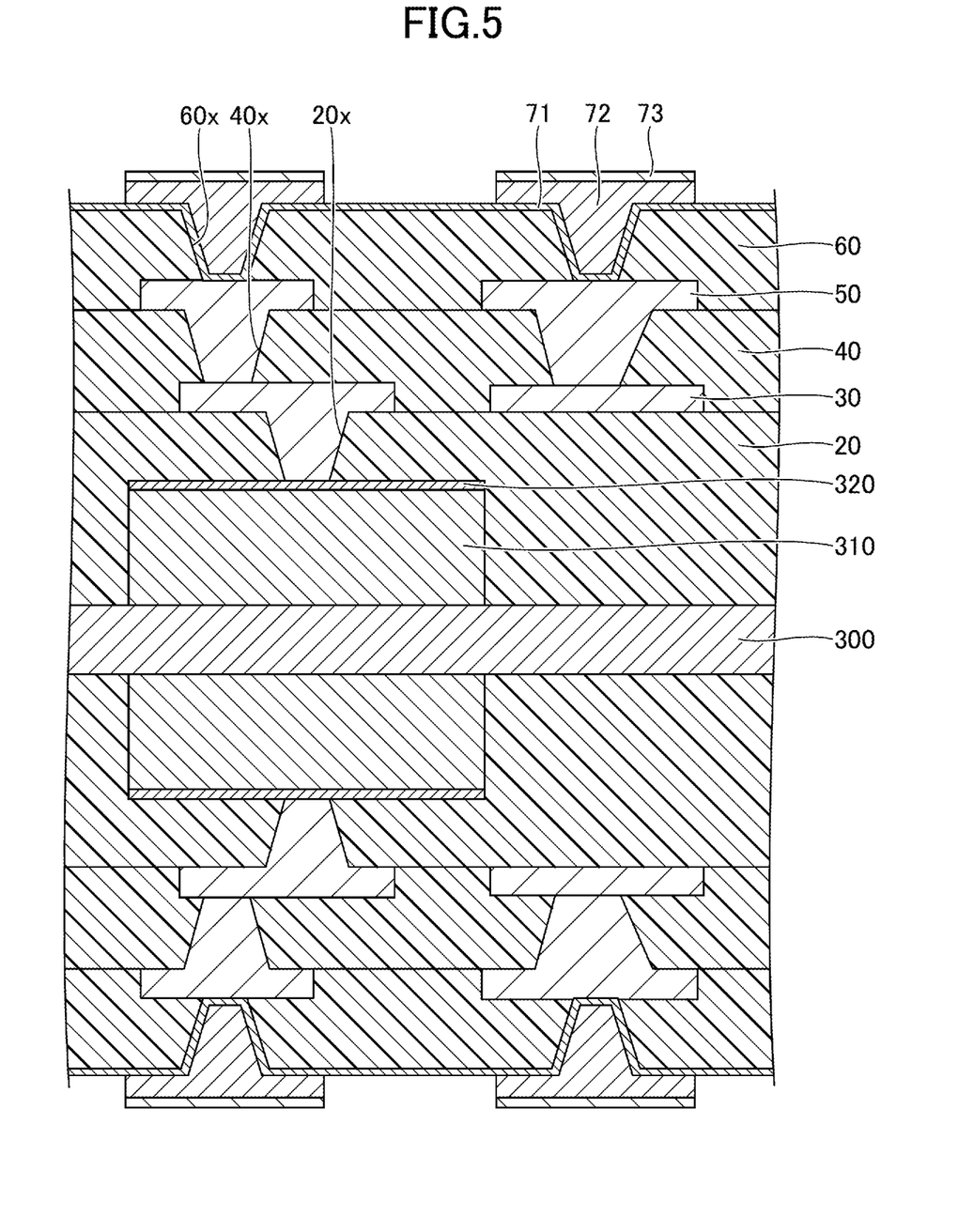
FIG. 5 is a drawing illustrating the method of making the interconnect substrate according to the first embodiment.

In the step illustrated in FIG. 5, a solder resist layer 60 is formed on the upper surface of the insulating layer 40 such as to cover the interconnect layer 50, and a via hole 60x is formed in the solder resist layer 60 such as to expose the upper surface of the via receiving pad of the interconnect layer 50. The solder resist layer 60 may be formed by, for example, applying photosensitive, insulating epoxy-based resin or acrylic-based resin in a liquid or paste form on the upper surface of the insulating layer 40 such as to cover the interconnect layer 50 by use of a screen printing method, a roll coating method, a spin coating method, or the like. Alternatively, a photosensitive, insulating epoxy-based-resin film or acrylic-based resin film may be laminated on the upper surface of the insulating layer such as to cover the interconnect layer 50. The via hole 60x may be formed by, for example, exposing and developing the solder resist layer 60. Before the solder resist layer 60 is formed, the surface of the interconnect layer 50 is preferably roughened.

A seed layer 71 is then formed by electroless plating or the like such as to continuously cover the upper surface of the solder resist layer 60, the inner surface of the via holes 60x, and the upper surface of the interconnect layer 50 exposed in the via holes 60x. A metal layer 72 and a surface covering layer 73 are selectively formed on the seed layer 71 by an electrolytic plating method for which power is supplied from the seed layer 71. To be more specific, a resist layer having openings at portions where the metal layer 72 and the surface covering layer 73 are to be formed is formed on the seed layer 71 by using a dry film resist or the like. The metal layer 72 and the surface covering layer 73, which are electrolytic plating layers, are successively laminated on the seed layer 71 exposed in the openings by an electrolytic plating method using the seed layer 71 as a power feeding layer. The materials and thicknesses of the seed layer 71, the metal layer 72, and the surface covering layer 73 are as described above. Thereafter, the resist layer is detached. The same applies to the lower surface side of the support 300.

Figure 6:
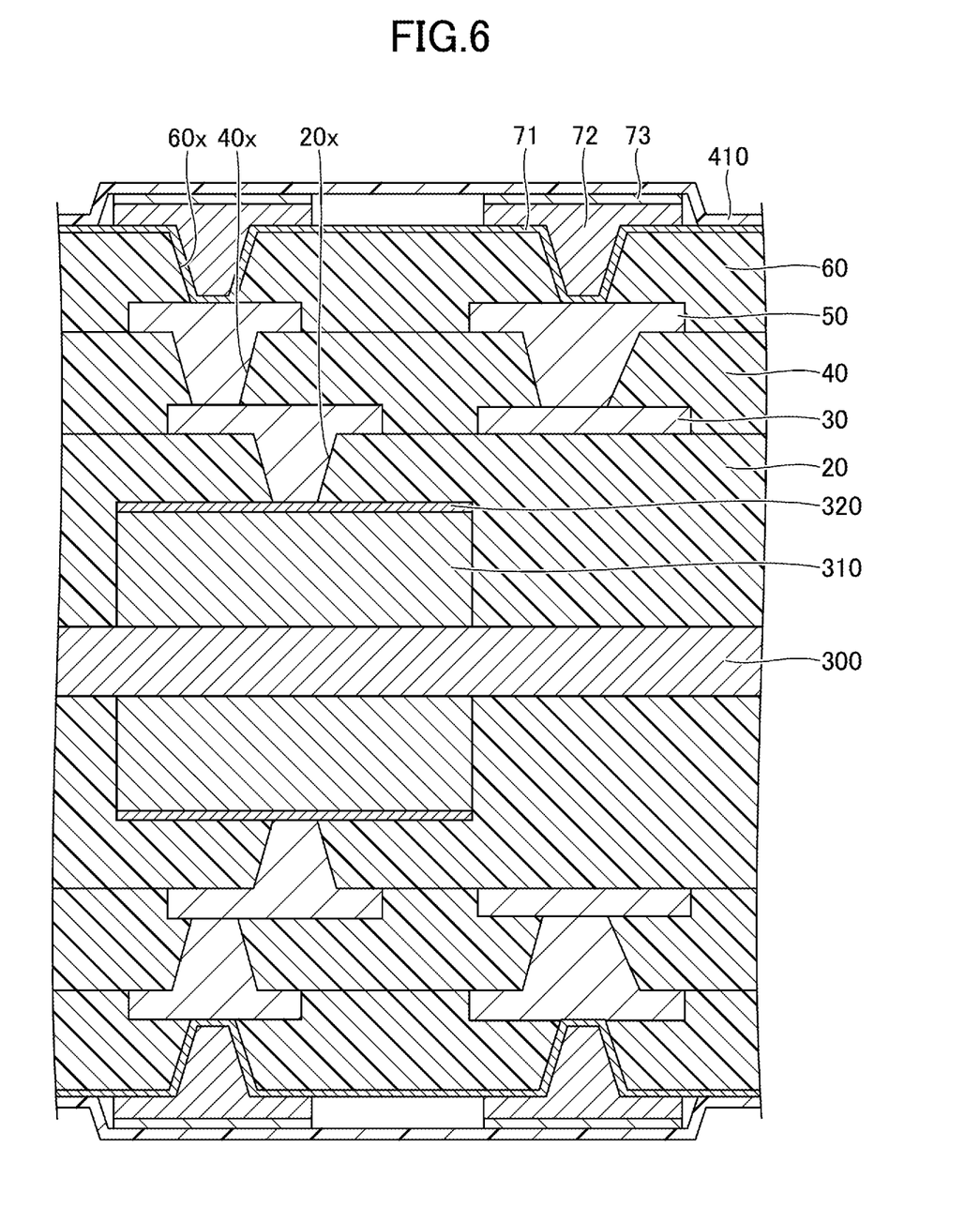
FIG. 6 is a drawing illustrating the method of making the interconnect substrate according to the first embodiment.

In the step illustrated in FIG. 6, a protective film 410 covering the seed layer 71, the metal layer 72, and the surface covering layer 73 is disposed over the solder resist layer 60. The same applies to the lower surface side of the support 300.

Figure 7A:
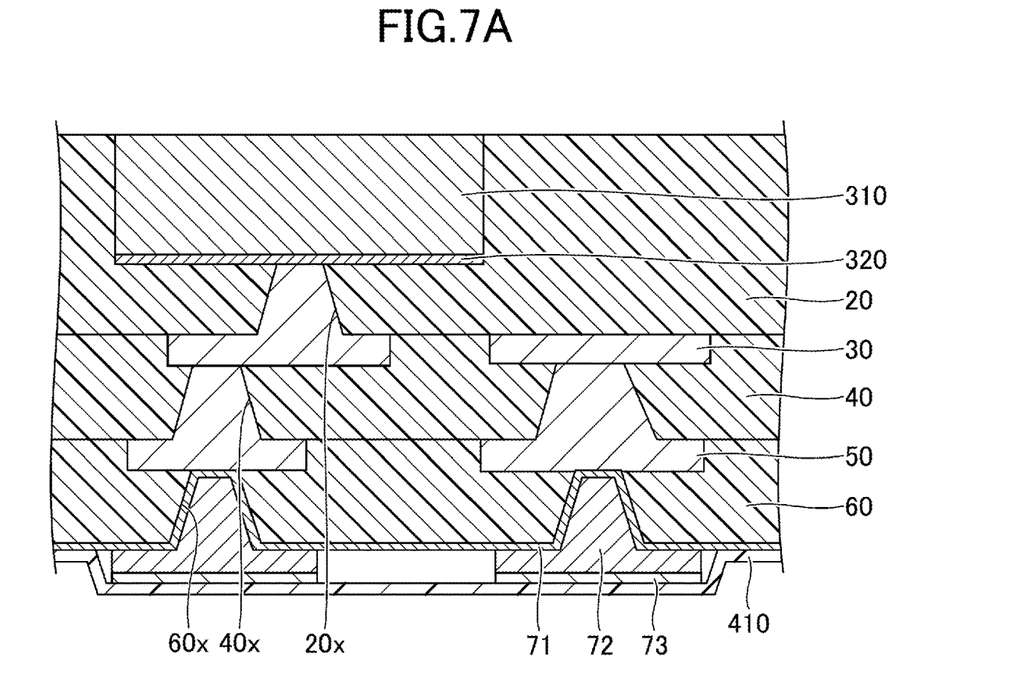
FIGS. 7A and 7B are drawings illustrating the method of making the interconnect substrate according to the first embodiment.

In the step illustrated in FIG. 7A, the structures formed on both sides of the support 300 are detached from the support 300. In the step illustrated in FIG. 7B, the sacrificial layers 310 and 320 are removed by etching, thereby forming a recess 20y in the insulating layer 20 at the place where the sacrificial layers 310 and 320 have been removed. The sacrificial layer 310, when made of copper, may be removed by wet etching using, for example, an etchant such as a hydrogen peroxide and sulfuric acid-based aqueous solution, a sodium persulfate aqueous solution, or an ammonium persulfate aqueous solution. The sacrificial layer 320, when made of nickel, may be removed by wet etching using, for example, a hydrogen peroxide and nitric acid-based aqueous solution or the like. The seed layer 71, the metal layer 72, and the surface covering layer 73 are covered with the protective film 410, and, thus, are not removed by the etching of the sacrificial layers 310 and 320.

Figure 7B:
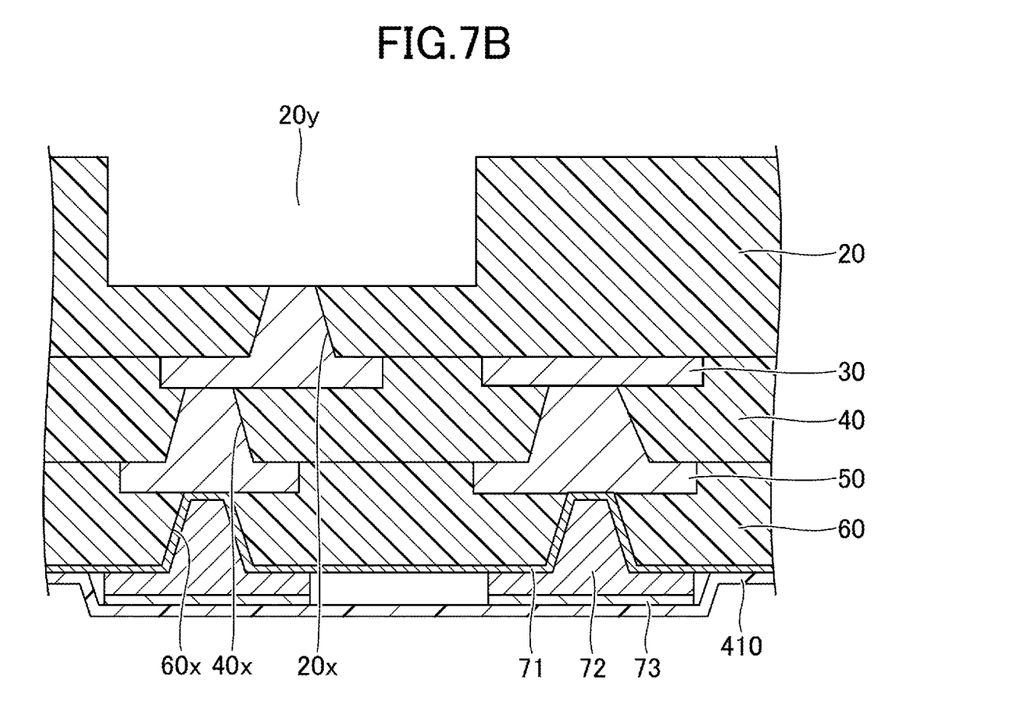

In the steps illustrated in FIGS. 8A and 8B through FIG. 10, the pad 10 for external connection is formed in the recess 20y such as to be connected to the interconnect layer 30. To be more specific, in the step illustrated in FIG. 8A, after the protective film 410 illustrated in FIG. 7B is removed, a seed layer 11 is formed by electroless plating or the like such as to continuously cover the upper surface of the insulating layer 20, the inner side surface of the recess 20y, the bottom surface of the recess 20y, and the upper surface of the interconnect layer 30 exposed in the recess 20y. A seed layer 74 is also formed by electroless plating or the like such as to cover the seed layer 71, the metal layer 72, and the surface covering layer 73. The material and thickness of the seed layer 11 are as described above. The material and thickness of the seed layer 74 may be, for example, substantially the same as those of the seed layer 11.

Figure 8A:
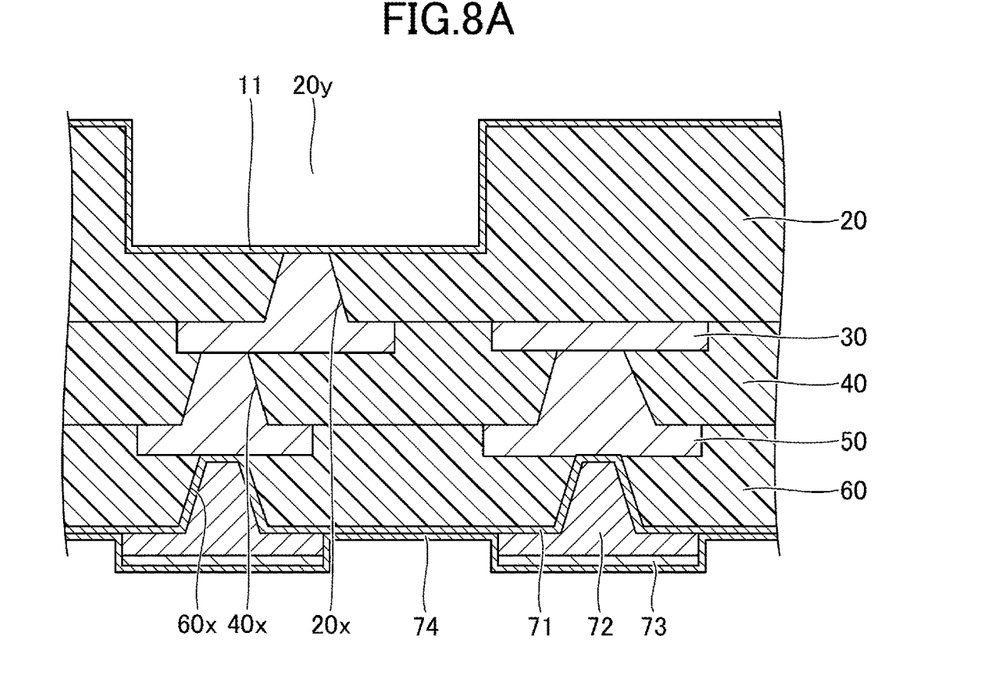
FIGS. 8A and 8B are drawings illustrating the method of making the interconnect substrate according to the first embodiment.
Figure 8B:
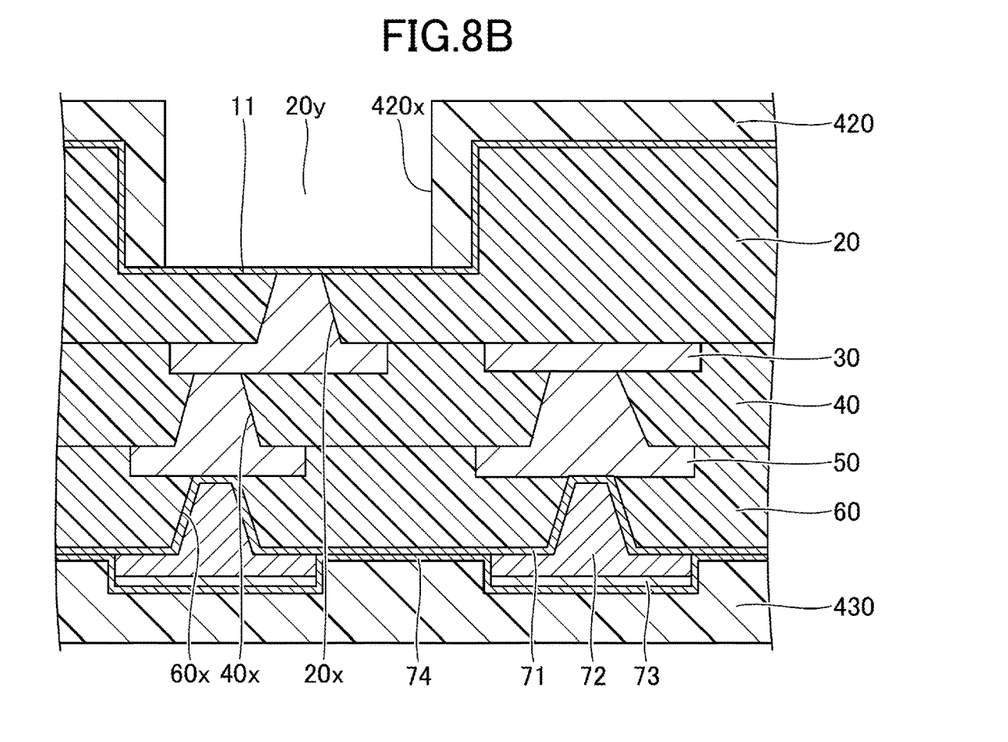

In the step illustrated in FIG. 8B, a dry film resist or the like is disposed on the seed layer 11, exposed to light, and developed to form a resist layer 420 having an opening 420x. The opening 420x exposes part of the upper surface of the seed layer 11 formed on the bottom surface of the recess 20y. Further, a resist layer 430 is formed on the seed layer 74 by using a dry film resist or the like.

Figure 9A:
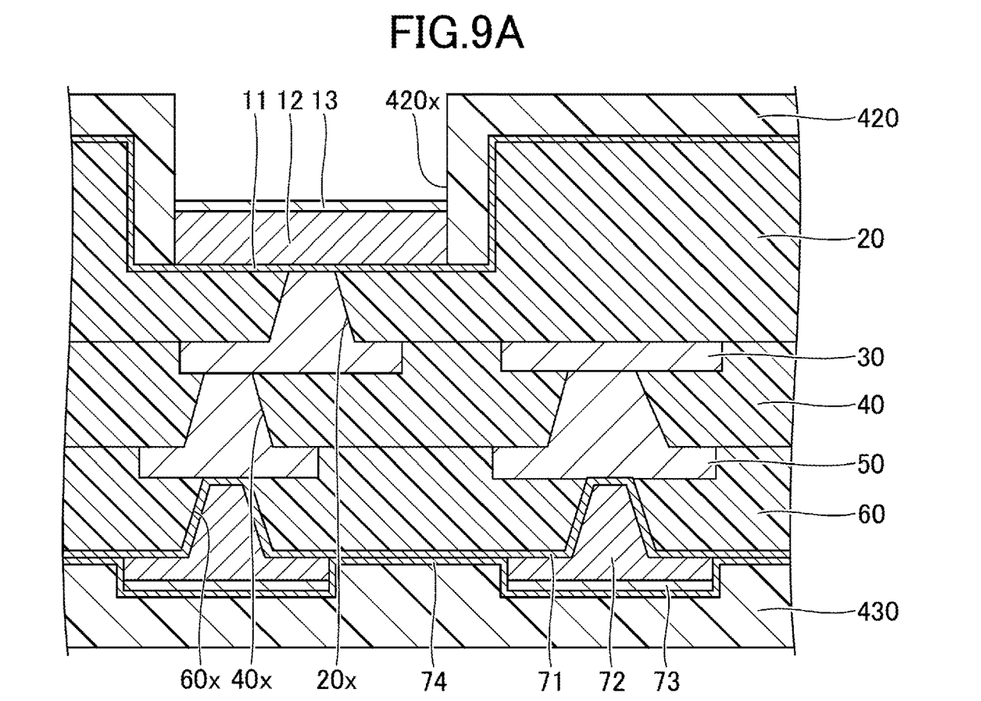
FIGS. 9A and 9B are drawings illustrating the method of making the interconnect substrate according to the first embodiment.

In the step illustrated in FIG. 9A, a metal layer 12 and a surface covering layer 13, which are electrolytic plating layers, are successively laminated on the seed layer 11 exposed in the opening 420x by an electrolytic plating method using the seed layer 11 exposed in the opening 420x as a power feeding layer. The materials and thicknesses of the metal layer 12 and the surface covering layer 13 are as described above.

Figure 9B:
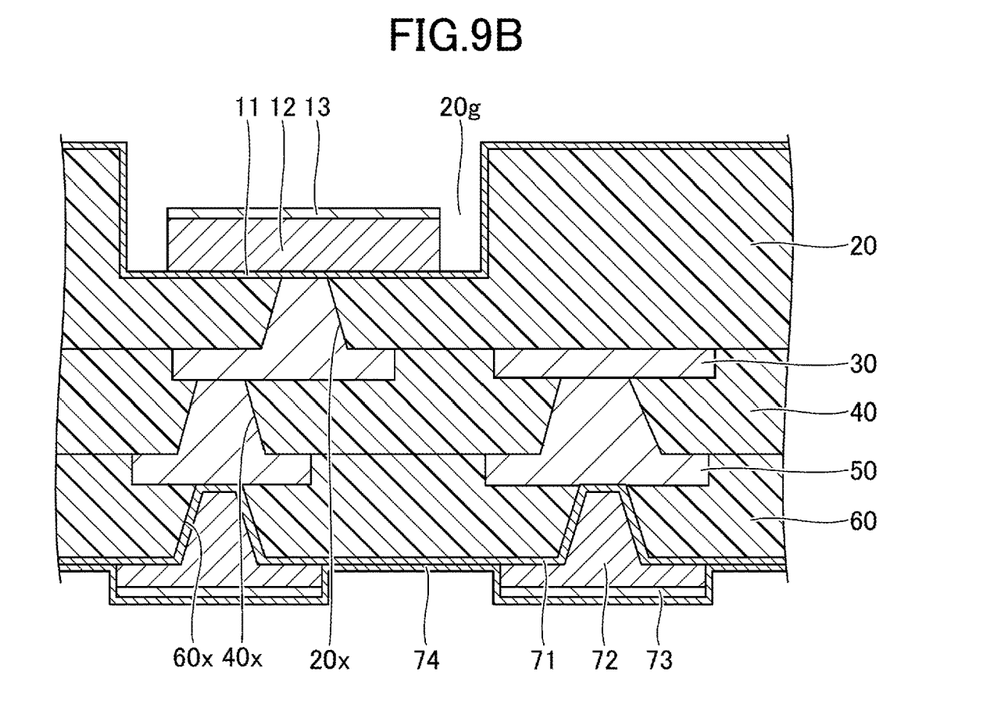

In the step illustrated in FIG. 9B, the resist layer 420 illustrated in FIG. 9A is detached. As a result, a groove 20g is formed around the metal layer 12 and the surface covering layer 13.

Figure 10:
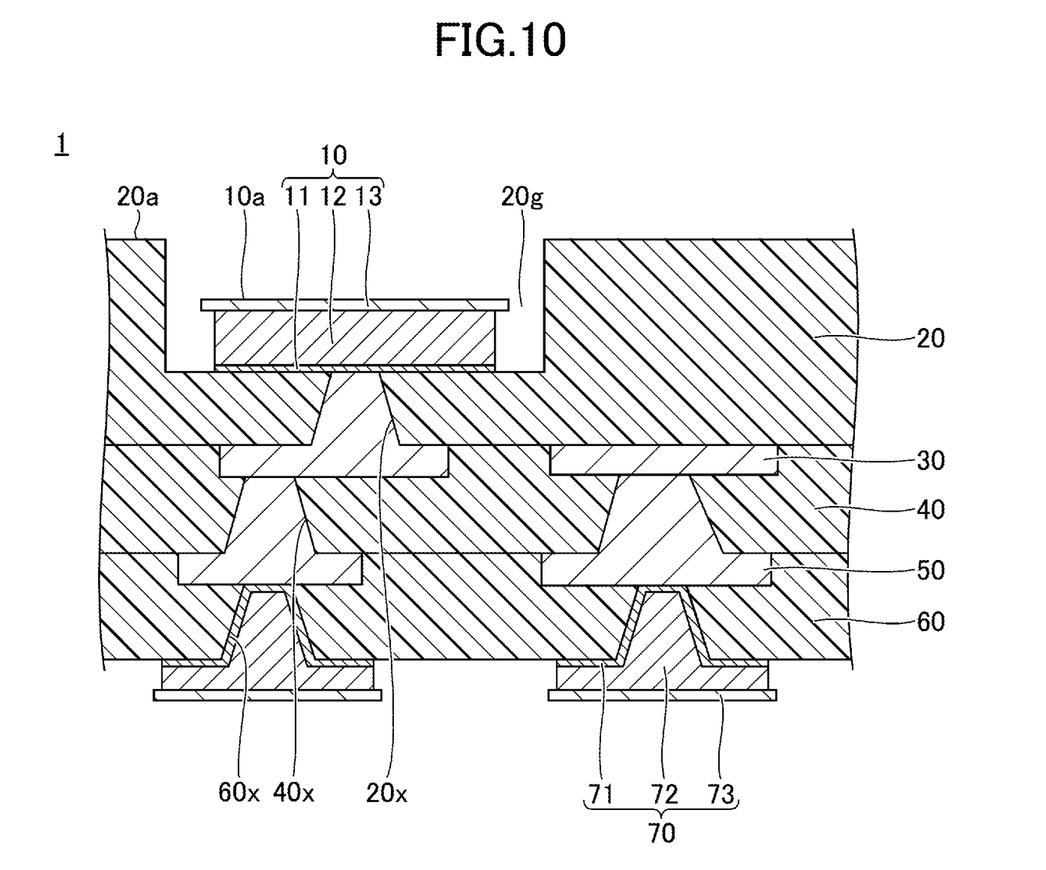
FIG. 10 is a drawing illustrating the method of making the interconnect substrate according to the first embodiment.

In the step illustrated in FIG. 10, etching is performed using the metal layer 12 and the surface covering layer 13 as a mask to remove the seed layer 11 exposed around the metal layer 12 and the surface covering layer 13. This creates a pad 10 including the seed layer 11, the metal layer 12, and the surface covering layer 13. When both the seed layer 11 and the metal layer 12 are copper layers, the side surface of the metal layer 12 is etched when the seed layer 11 is etched. As a result, the perimeter of the surface covering layer 13 protrudes further out than the side surface of the metal layer 12 toward the inner side surface of the groove 20g.

The above-noted etching also removes the seed layer 71 exposed around the metal layer 72 and the surface covering layer 73. This produces an interconnect layer 70 including the seed layer 71, the metal layer 72, and the surface covering layer 73. When both the seed layer 71 and the metal layer 72 are copper layers, the side surface of the metal layer 72 is etched when the seed layer 71 is etched. As a result, the perimeter of the surface covering layer 73 protrudes further out than the side surface of the metal layer 72, which is a copper layer. With this, the interconnect substrate 1 is completed in final form.

It may be noted that the protective film 410 provided in the step illustrated in FIG. 6 may not be removed before the step illustrated in FIG. 8A, and may instead be removed after the step illustrated in FIG. 10. With this arrangement, there is no need to form the seed layer 74 and the resist layer 430.

First Variation of First Embodiment

The first variation of the first embodiment is directed to an example in which the shape of the surface covering layer is different from that of the first embodiment. In the first variation of the first embodiment, a description of the same components as those of the above-described embodiment may be omitted.

Figure 11:
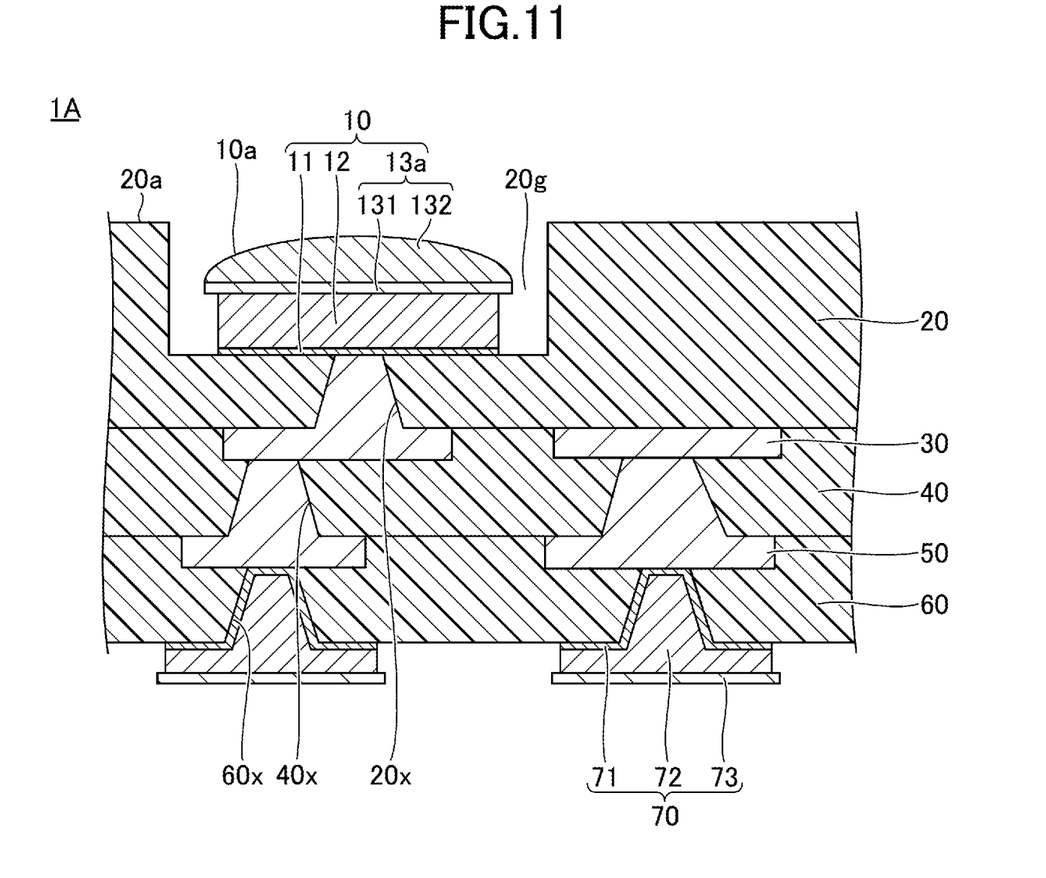
FIG. 11 is a drawing illustrating an interconnect substrate according to a first variation of the first embodiment.

FIG. 11 is a partial cross-sectional view illustrating an interconnect substrate according to the first variation of the first embodiment. Referring to FIG. 11, an interconnect substrate 1A differs from the interconnect substrate 1 (see FIG. 1, for example) in that the upper surface of a surface covering layer 13a of the pad 10 is not flat but curved in a convex shape. The surface covering layer 13a has, for example, a two-layer structure including a first layer 131 and a second layer 132. As an example, the first layer 131 is a nickel layer, and the second layer 132 is a tin layer. It may be noted that the upper surface of the second layer 132 made of tin could alternatively be flat, but is curved in a convex shape in this configuration. A reflow process may be utilized to shape the upper surface of the second layer 132 made of tin into a convex curve. The shape of the second layer 132 is, for example, a dome shape.

As described above, the uppermost layer of the surface covering layer may be a tin layer. In this case, the upper surface of the tin layer may be a flat surface or a curved convex surface. The upper surface of the tin layer that is curved in a convex shape such as a dome shape facilitates connection with an object. Further, the use of a tin layer as the uppermost layer of the surface covering layer eliminates the need to form a solder ball or the like on the pad 10 of the interconnect substrate 1A for the purpose of establishing connection with an object, and is thus preferable.

Second Variation of First Embodiment

The second variation of the first embodiment is directed to another example in which the shape of the surface covering layer is different from that of the first embodiment. In the second variation of the first embodiment, a description of the same components as those of the above-described embodiments may be omitted.

Figure 12:
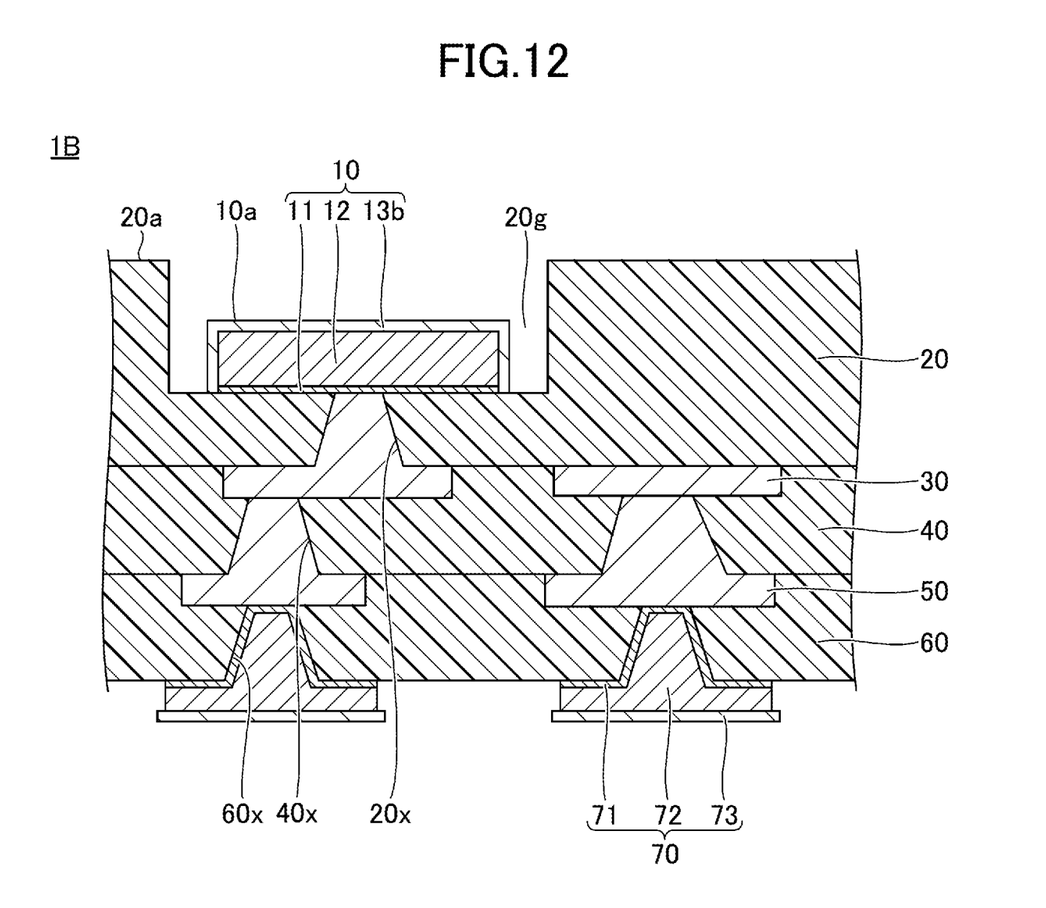
FIG. 12 is a drawing illustrating an interconnect substrate according to a second variation of the first embodiment.

FIG. 12 is a partial cross-sectional view illustrating an interconnect substrate according to the second variation of the first embodiment. Referring to FIG. 12, an interconnect substrate 1B differs from the interconnect substrate 1 (see FIG. 1, for example) in that the side surface of the seed layer 11 and the upper and side surfaces of the metal layer 12 are covered with a surface covering layer 13b. The surface covering layer 13b is an organic coating film. The organic coating film contains, for example, an azole compound, an imidazole compound, or the like. In this manner, the organic coating film may be formed on all the surface of the pad 10 that is not covered with the insulating layer 20.

The second variation of the first embodiment may be combined with the first embodiment or the first variation of the first embodiment. For example, in FIG. 1B, the side surfaces of the seed layer 11 and the metal layer 12 of the pad 10 may be covered with an organic coating film. Further, the side surface of the seed layer 71 and the side surface of the metal layer 72 may be covered with an organic coating film.

Although preferred embodiments and the like have been described in detail above, the present invention is not limited to the above-described embodiments and the like, and various modifications and substitutions can be added to the above-described embodiments and the like without departing from the scope described in the claims.

According to at least one embodiment, an interconnect substrate is provided such that the perimeter of a pad for external connection is situated inside the perimeter of an opening of an insulating layer in a plan view.

The present disclosures non-exhaustively include the subject matter set out in the following clause:

Clause 1. A method of making an interconnect substrate, comprising:
    forming a sacrificial layer at a predetermined position on an upper surface of a support;
    forming an insulating layer on the upper surface of the support such that the insulating layer covers the sacrificial layer;
    forming an interconnect layer on the insulating layer;
    removing the support and the sacrificial layer to form a recess in the insulating layer at a place where the sacrificial layer is removed; and
    forming a pad for external connection in the recess such that the pad is connected to the interconnect layer,
    wherein part of an upper surface of the pad is covered with the insulating layer,
    wherein the pad is situated in the recess in the insulating layer such that a groove is present between the pad and a perimeter of the recess around the pad in a plan view, and wherein a bottom surface of the groove is coplanar with the upper surface of the pad.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An interconnect substrate, comprising:
   a pad for external connection; and
   an insulating layer,
   wherein part of a lower surface of the pad is covered with the insulating layer,
   wherein the pad is situated in a recess formed in an upper surface of the insulating layer, such that a groove is present between the pad and a perimeter of the recess around the pad in a plan view of the interconnect substrate,
   wherein a bottom surface of the groove is coplanar with the lower surface of the pad, and
   wherein the lower surface of the pad that is coplanar with the bottom surface of the groove is in contact with a via hole extending through the insulating layer, and an entire side surface of the pad is positioned apart from an inner side surface of the groove.

2. The interconnect substrate as claimed in claim 1, wherein the pad includes a seed layer in contact with the bottom surface of the groove and an electrolytic plating layer laminated on the seed layer.

3. The interconnect substrate as claimed in claim 2, wherein the electrolytic plating layer has a laminated structure, and the electrolytic plating layer includes a copper layer laminated on the seed layer and a surface covering layer laminated on the copper layer.

4. The interconnect substrate as claimed in claim 3, wherein a perimeter of the surface covering layer protrudes further out than a side surface of the copper layer toward an inner side surface of the groove.

5. The interconnect substrate as claimed in claim 3, wherein an uppermost layer of the surface covering layer is a gold layer.

6. The interconnect substrate as claimed in claim 3, wherein an uppermost layer of the surface covering layer is a tin layer.

7. The interconnect substrate as claimed in claim 6, wherein an upper surface of the tin layer is curved in a convex shape.

8. The interconnect substrate as claimed in claim 1, wherein the pad has an organic coating film on an entire surface area thereof that is not covered with the insulating layer.

9. The interconnect substrate as claimed in claim 1, wherein an upper surface of the pad is situated lower than the upper surface of the insulating layer.

10. The interconnect substrate as claimed in claim 1, wherein the entire side surface of the pad is exposed and includes an upper side surface and a lower side surface, the upper side surface extending further outward than the lower side surface toward the inner side surface of the groove.

11. An interconnect substrate, comprising:
    a pad for external connection; and
    an insulating layer,
    wherein part of a lower surface of the pad is covered with the insulating layer,
    wherein the pad is situated in a recess formed in an upper surface of the insulating layer, such that a groove is present between the pad and a perimeter of the recess around the pad in a plan view of the interconnect substrate,
    wherein a bottom surface of the groove is coplanar with the lower surface of the pad,
    wherein the pad includes a seed layer in contact with the bottom surface of the groove and an electrolytic plating layer laminated on the seed layer,
    wherein the electrolytic plating layer has a laminated structure, and the electrolytic plating layer includes a copper layer laminated on the seed layer and a surface covering layer laminated on the copper layer, and
    wherein an entire side surface of the pad is positioned apart from an inner side surface of the groove.

* * * * *